(12) United States Patent
May

(10) Patent No.: US 7,199,572 B1
(45) Date of Patent: Apr. 3, 2007

(54) METHOD AND SYSTEM FOR IMPROVING THE OPERATIONAL SAFETY, RELIABILITY, AND FUNCTIONALITY OF ELECTRICAL POWER CONSUMPTION MONITORING DEVICES

(76) Inventor: Greg May, 5207 S. Sawgrass Cir., Sioux Falls, SD (US) 57108

(*) Notice: Subject to any disclaimer, the term of this patent is extended or adjusted under 35 U.S.C. 154(b) by 93 days.

(21) Appl. No.: 11/069,350

(22) Filed: Mar. 1, 2005

(51) Int. Cl.
*G01R 1/04* (2006.01)

(52) U.S. Cl. .................................................... 324/156

(58) Field of Classification Search ............... None
See application file for complete search history.

(56) References Cited

U.S. PATENT DOCUMENTS

| | | | | |
|---|---|---|---|---|
| 4,404,521 A | * | 9/1983 | Fennell | 324/110 |
| 5,546,269 A | * | 8/1996 | Robinson et al. | 361/660 |
| 5,834,932 A | | 11/1998 | May | |

OTHER PUBLICATIONS

Internet, "www.themeterguy.com/Theory/mystery6!.htm.Mystery6!," no date.
Internet, "www.themeterguy.com/Theory/meter_math.htm, Meter Math," no date.
American National Standards Institute, Inc., "ANSI," no date.
N Trac, "NEETRAC," no date.
Hunt Technologies, "TS2," no date.

* cited by examiner

*Primary Examiner*—Ha Tran Nguyen
*Assistant Examiner*—Trung Q. Nguyen

(57) ABSTRACT

A system and method for reducing the likelihood of a phase to phase or phase to neutral arcing failure, or a flashover in an electrical power consumption monitoring device. The method includes generating a reduced voltage from either a single phase or two phases of the electrical service provided, and utilizing the reduced voltage to supply the power supply circuits of the watthour meter and/or the data transmission circuits. A step-down auto-transformer may be used to generate the reduced voltage to thereby not only reduce the voltage available to the monitoring and data transmitting circuits of the watthour meter, but also limiting the current carried to those circuits. Because the total available power is reduced, the likelihood of a catastrophic failure caused by arcing within the watthour meter or a MOV failure is significantly reduced.

19 Claims, 6 Drawing Sheets

METHOD AND SYSTEM FOR IMPROVING THE OPERATIONAL SAFETY, RELIABILITY, AND FUNCTIONALITY OF ELECTRICAL POWER CONSUMPTION MONITORING DEVICES

BACKGROUND OF THE INVENTION

1. Field of the Invention

The present invention relates to watthour meter systems for measuring the energy consumed by loads connected to the lines of power systems, and more particularly pertains to a new method and system for improving the operational safety, reliability, and functionality of electrical power consumption monitoring devices, especially during a changeover of the monitoring devices.

2. Description of the Prior Art

In general, the use of watthour meter systems is known in the prior art. U.S. Pat. No. 5,834,932, issued on Nov. 10, 1998 to Gregory R. May, contains an excellent description of the types and forms of watthour meter systems known in the prior art. The disclosure of the U.S. Pat. No. 5,834,932 patent is hereby incorporated by reference in its entirety into this disclosure to the extent that it is not inconsistent with the present invention.

Electrical energy consumption measuring systems may take the form of an electrical watthour meter system. A typical electrical watthour meter may include both voltage sensing windings and current sensing windings internal thereto. The voltage sensing windings are each constructed and arranged so that the electrical meter may measure a first voltage appearing across that voltage sensing winding and determine a second voltage appearing across at least two lines of an electrical circuit system. Each current sensing winding of the electrical meter is constructed and arranged so that the electrical meter may measure a first current driven through that current sensing winding and determine a second current driven through a line of the electrical circuit system.

An electrical watthour meter is typically seated into (and removed from) a meter socket, and the mounting and removal from the socket may occur even while the power line to which the meter socket is connected remains "live" or "hot" with power. The meter socket is typically configured to matingly receive elements of the electrical meter. The meter socket may include a plurality of socket terminals, which may take the form of jaw-like structures sometimes referred to as "jaws". The electrical meter may include a plurality of conductor lugs, which may take the form of blade-like structure sometimes referred to as "stabs". The jaws of the meter socket removably receive the stabs of the electrical meter when the meter is mounted on the meter socket, provided that the conductor stabs are in registry with the socket jaws.

For several decades, it was common practice to utilize personnel to periodically visit each meter and physically read the meter for the purposes of billing. More recently, systems have been developed to not only automate this process, but also to provide load management capabilities. One such system is a data transmitter which employs Power Line Carrier (PLC) communication techniques to facilitate communication between the electrical meter and an electrical substation. The data transmitted from the electrical meter to the substation can then be translated for retransmission to a central office using a variety of communication channels including telephone land lines, cellular telephones, and satellite systems. These systems can be either external or internal to the electrical meter. As an illustrative example, Hunt Technologies of 6436 County Road 11, Pequot Lakes, Minn. 56477, sells data transmission systems of this type under the trade name TURTLE, although other systems are available and may be employed.

Because of the significant advantages provided by this type of automated system, many utility companies are electing to upgrade many if not all of their electrical meters to reduce the labor required to read the meters, as well as to gain information about power consumption for each load or customer, and, in the instances of two-way communication systems, obtain some load management capabilities as well. Physically changing out these meters is not only labor intensive, it can also be extremely dangerous when the power line to which the meter socket is connected is live or hot with power. While the electrical meter can be removed by simply pulling the meter away from the meter socket and replaced by pushing a meter onto the meter socket regardless of whether or not power is applied or whether a load is connected to the output of the meter, the presence of live power presents a hazard that cannot always be avoided. And the danger associated with the change out of the electrical meter significantly increases in the case of higher voltage poly phase power lines, such as the 480 volt three phase systems commonly used for agricultural and industrial services. While some utilities require that an entire electrical service be disconnected from live power prior to a lineman changing out an electrical meter, the disconnection may not be practical for a variety of reasons, such as when the electrical service provides power for an entire shopping center or industrial installation.

Installing and maintaining new or retrofit electrical meters on live power services exposes the system to at least two separate sources of potentially catastrophic failures. These failures include failure of a metal oxide varistor (MOV) in the meter, and arcing between the conductors of the service during installation of the meter, both of which can lead to phase-to-phase or phase-to-neutral faults and potentially cause a full flashover event.

MOVs are fast acting variable resistors which present a relatively higher impedance at normal operating voltages, and a relatively lower impedance at higher than normal operating voltages. As will be readily appreciated by those skilled in the art, MOVs are commonly used to protect circuits from over-voltage conditions. Illustrative examples of such over-voltage conditions are a lightning strike, ungrounded wye/delta phenomena, and ferro-resonnance. As useful as MOVs may be in protecting circuits, they do have at least one potential shortcoming, specifically a negative temperature coefficient. Thus as a MOV becomes hotter, its resistance decreases and the MOV will carry more current, which will in turn increase the heat generated by the MOV. This can lead to a thermal runaway in which the MOV may rupture from the excess heat and may expel hot conductive materials and gases. Because of the relatively close physical proximity of the electrical terminals, in both the meter and the junction box on which the meter socket is typically mounted, the conductive gases may reduce the insulating nature of the air in the meter or junction box and induce a flashover. For the purposes of this disclosure, a flashover is defined as a disruptive discharge around or over the surface of an insulator. As can be appreciated, a flashover at relative high voltages and currents can be extremely hazardous and destructive.

A second failure mechanism that is sometimes present in removing, maintaining, or installing electrical meters occurs when the electrical service to the meter is live, and a load is present on the output of the meter. As a terminal of the meter either makes or begins to break contact with a terminal of the meter socket for at least one phase of the electrical power, arcing can occur. The arcing ionizes the surrounding atmosphere making the air more conductive, which then promotes increased arcing, flashover, and even the explosive destruction of the meter and junction box.

As discussed above, attempts to solve these problems have centered on disconnecting the power supplied to the junction boxes of the meter socket or disconnecting the entire service, including the power transformers, before changing out meters. However, this practice inevitably disrupts the supply of power to at least one, and in some occasions many, customers, and for commercial customers this may be unacceptable during normal business hours. In addition, energizing the high voltage side of the power transformers one phase at a time can sometimes create significantly higher than normal voltages on the secondary, contributing to the failure of the meter,

SUMMARY OF THE INVENTION

Installing and maintaining new or retrofit electrical meters on a live power line exposes the system to at least two separate sources of potentially catastrophic failures. The present invention presents a seemingly simple solution to the vexing problems noted above. Yet, despite the apparent simplicity of the solution, it is one that has to this point evaded discovery by those skilled in this area of technology. Generally, the invention employs a voltage reduction device for application in conjunction with elements of an electrical energy consumption measuring system, which generally comprise an electrical meter and a meter socket for receiving the electrical meter.

The present invention includes a method of improving the safety of installing, maintaining, operating and removing these electrical energy consumption measuring systems that includes providing a step-down transformer to limit the voltage (and, to a significant extent, limit the current) available to the meter power supply (and any data transmitter present on the meter) to thereby limit the potential for the occurrence of a fault to support a flashover.

The present invention may also be implemented in any one of multiple physical apparatus configurations. Preferred embodiments of a retrofit configuration and a new installation configuration are described more fully below. The inventor also contemplates that at least one new ANSI meter form standard may be generated as well.

It should also be appreciated that the present invention can be utilized in a variety of electrical systems of varying voltages and phase configurations. However, it is in higher voltage poly phase circuits where the benefits of the present invention are most easily realized. One illustrative application is in 480 volt three-phase configurations, such as those employing a three wire delta configuration.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Advantages of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects of the invention will become apparent when consideration is given to the following detailed description thereof. Such description makes reference to the annexed drawings wherein.

DESCRIPTION OF PREFERRED EMBODIMENTS

Figure 1:
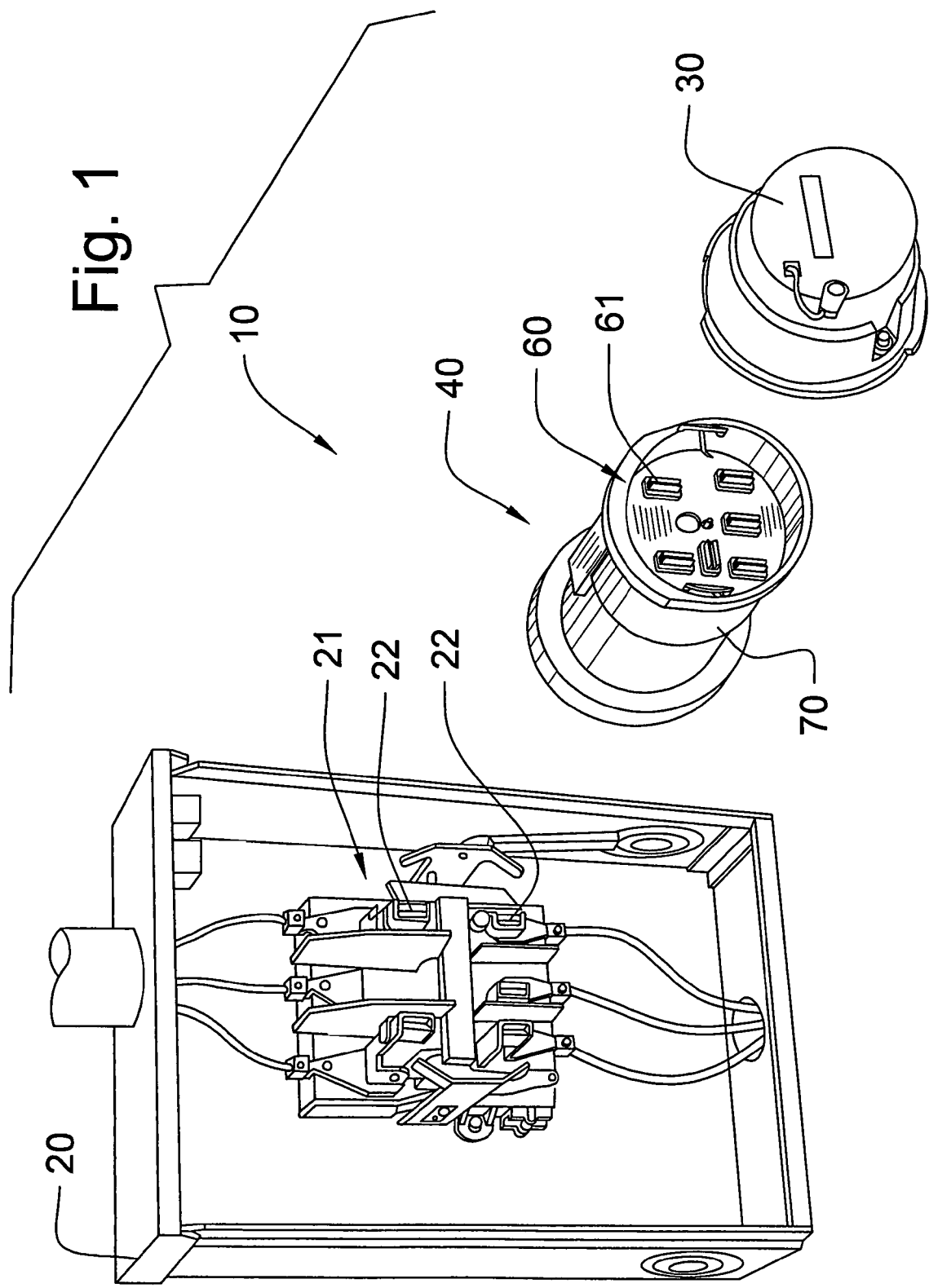
FIG. 1 is a schematic exploded perspective view of a new system for improving the operational safety, reliability, and functionality of electrical power consumption monitoring devices according to the present invention. Particularly illustrated is an electrical meter socket positioned in a cabinet, an adapter according to the present invention, and an electrical meter.

With reference now to the drawings, and in particular to FIGS. 1 through 5 thereof, a new system for improving the operational safety, reliability, and functionality of electrical power consumption monitoring devices therefore embodying the principles and concepts of the present invention and generally designated by the reference numeral 10 will be described.

As best illustrated in FIGS. 1 through 5, the system 10 for improving the operational safety, reliability, and functionality of electrical power consumption monitoring devices generally comprises an adapter 40 with a step-down voltage transformer 50. The adapter 40 that is highly suitable for use with a meter socket 21 that may be located in a junction box 20, and an electrical meter 30.

In a first preferred configuration of the invention, a retrofit of an existing electrical power consumption metering system is addressed utilizing a pre-existing junction box 20 with the meter socket 21 and an existing electrical meter 30. For convenience of description, this configuration will be referred to as a first retrofit configuration. The adapter 40, which may have a sleeve-like configuration, is positioned between the meter socket 21 in the junction box 20 and the electrical meter 30. In the final assembled state, the meter 30 is mounted on the adapter 40, and the adapter 40 is in turn mounted on the meter socket 21. The electrical meter 30 may be modified, if necessary, although it is preferred that the adapter 40 may be inserted between the meter 30 and the meter socket 21 without making any significant alterations of these components. The adapter 40 may include a first end or portion 41 having a plurality of stabs or lugs 42 for mating with a plurality of jaws or socket terminals 22 of the meter socket 21. As will be readily appreciated by those skilled in the art, each form of meter lug configuration will have a corresponding and complementary form of meter socket terminal configuration.

Figure 3A:
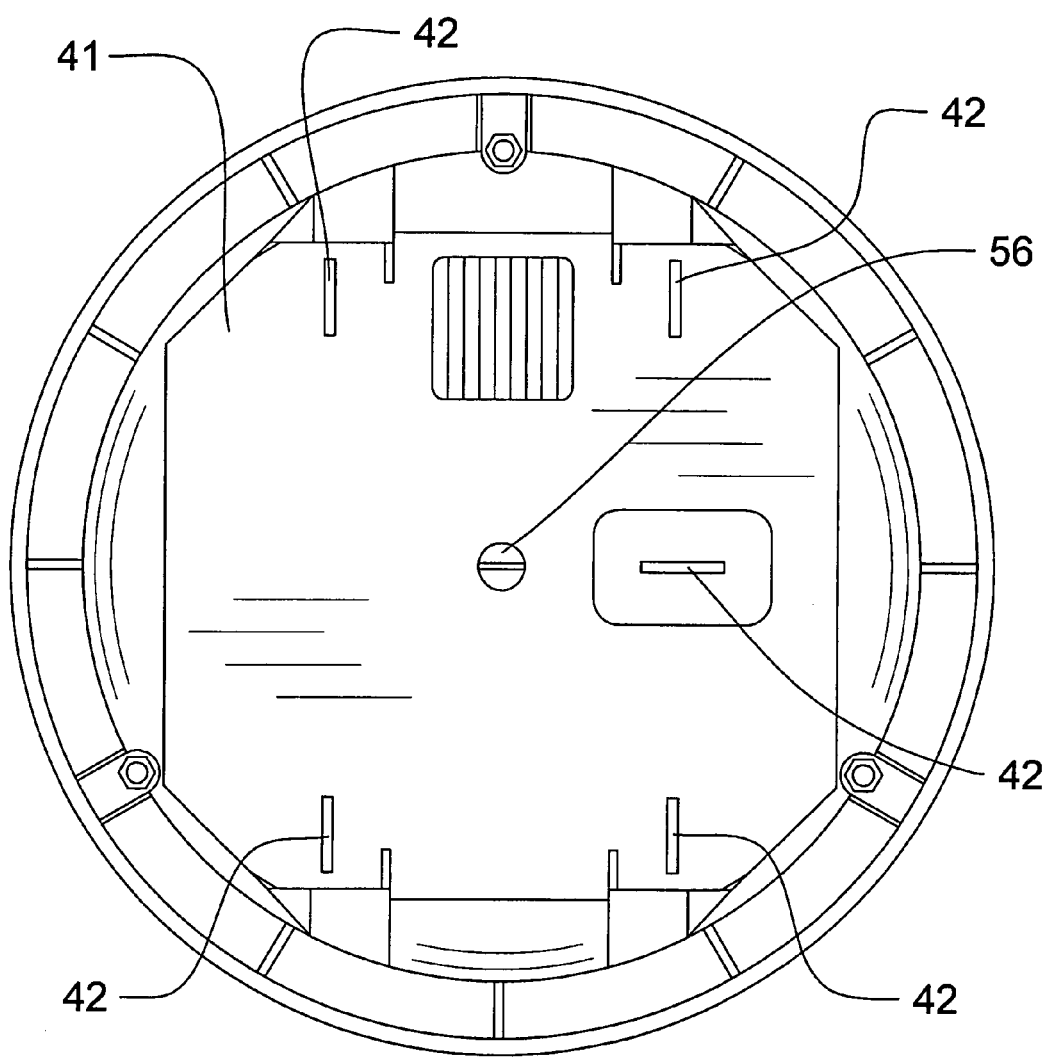
FIG. 3A is a schematic view of a first optional configuration of a second end of the adapter which is suitably configured to couple to a meter socket.
Figure 3B:
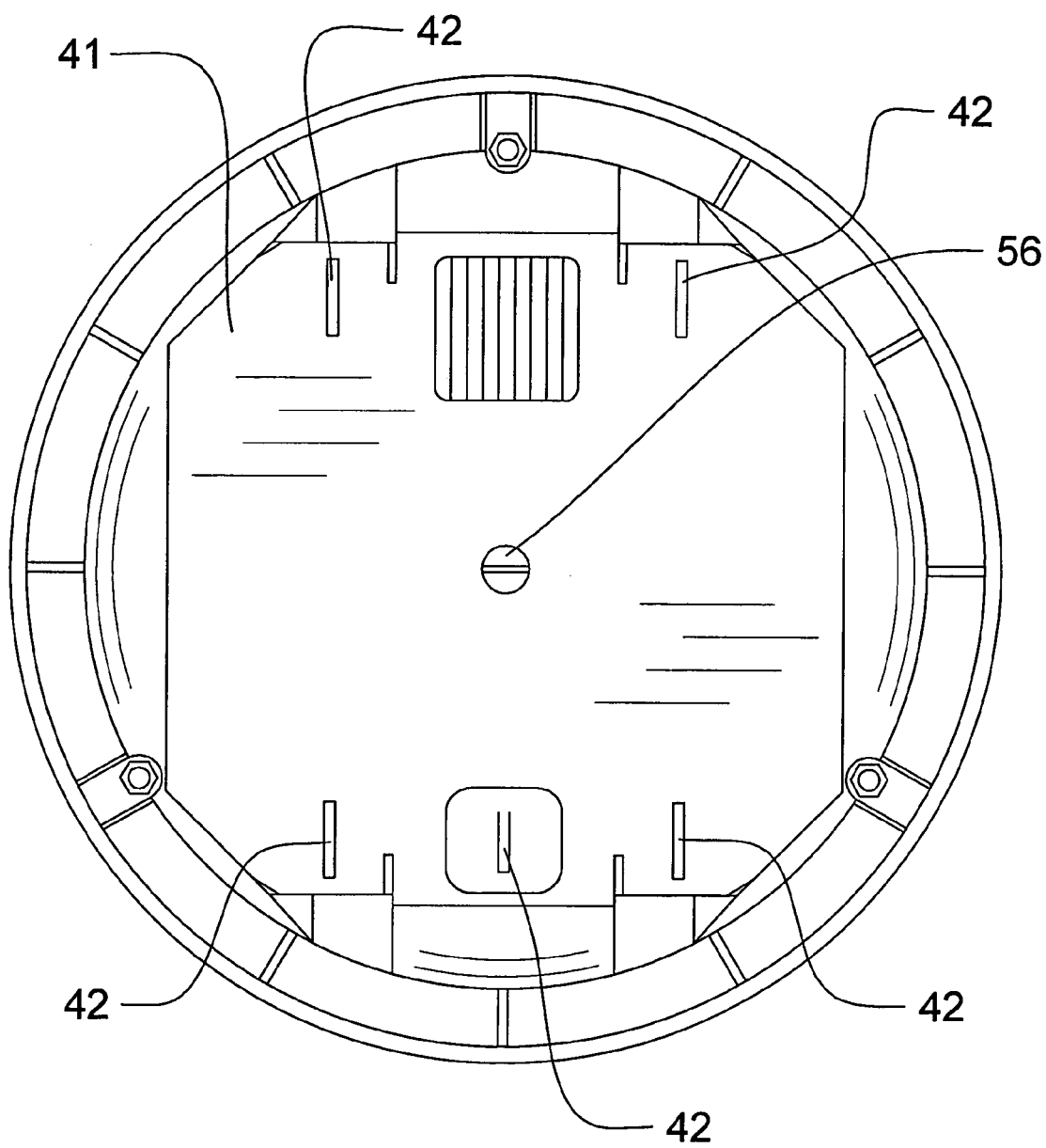
FIG. 3B is a schematic view of a second optional configuration of the second end of the adapter which is suitably configured to couple to a meter socket.
Figure 4:
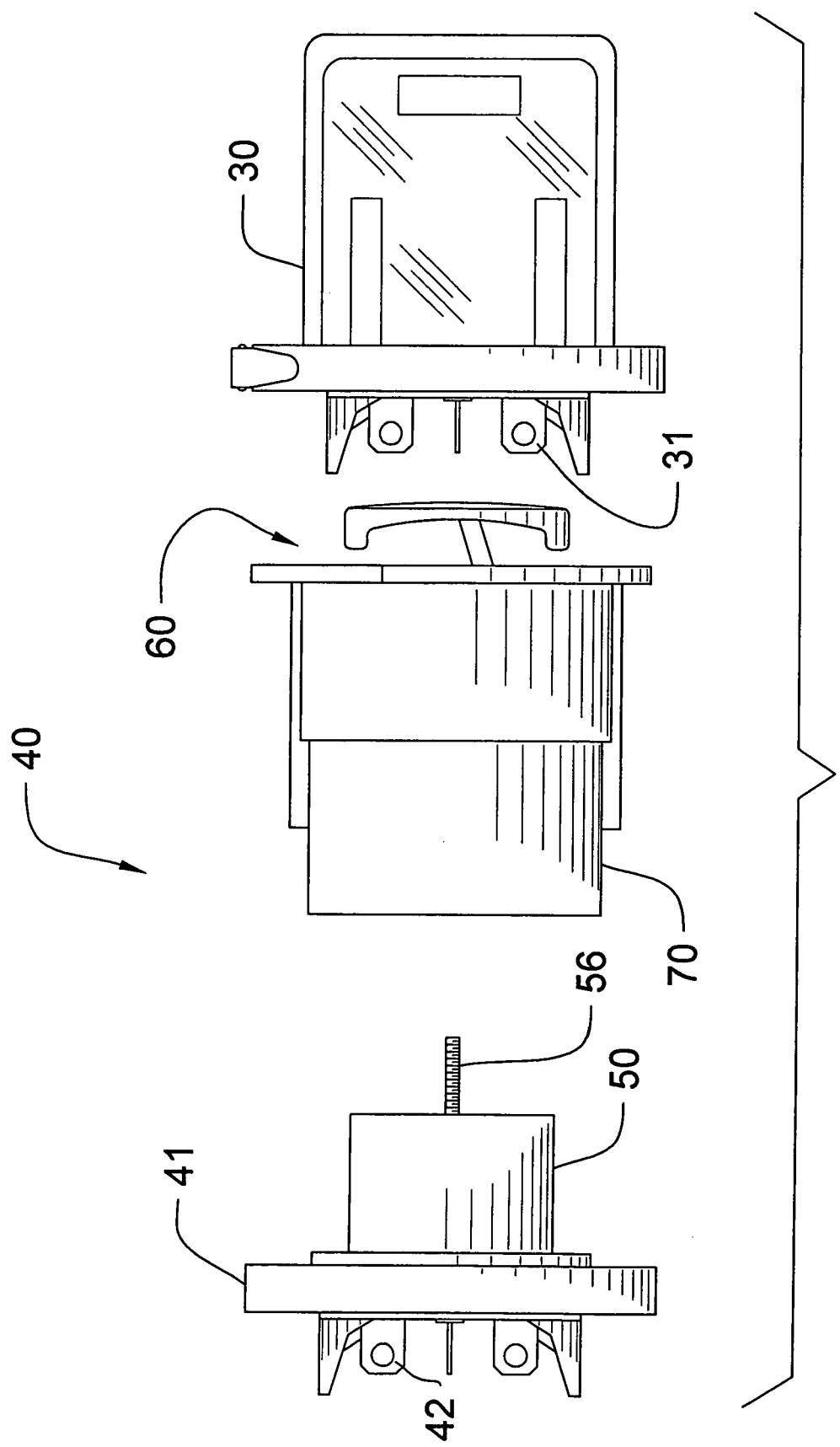
FIG. 4 is a schematic exploded side view of the adapter of the present invention.

In FIG. 1, an illustrative three-phase service is shown entering the junction box 20 and being electrically coupled to the socket terminals 22 of the meter socket 21. Each of the plurality of lugs 42 of the first end or portion 41 of the adapter 40 (see FIGS. 3A and 3B) can be mated to an associated one of the socket terminals 22 of the meter socket 21 when the adapter 40 is mounted to the meter socket 21. In a sense, the first end or portion 41 of the adapter 40 mimics, or is configured similar to, the portion of the meter 30 which is designed to mate with the meter socket 21, although it should be realized that an identical configuration is not required. As shown in FIG. 3A, one of the lugs 42 may be positioned on the first portion 41 in a location that is suitable for mating with a socket terminal 22 in a "nine o'clock position" on the meter socket 21, and as shown in FIG. 3B, one of the lugs 42 may be positioned on the first portion 41 in a location that is suitable for mating with a socket terminal 22 in a "six o'clock position" on the meter socket 21. Optionally, both positions may be supported by the lugs 22 of the adapter 40.

The adapter sleeve 40 includes a step-down transformer 50 that is electrically connected either between one phase and a neutral of the electrical service, or between two phases of the electrical service. This may be accomplished by connecting the transformer 50 to one or more of the plurality of lugs 42 of the first portion 41 of the adapter 40, and most suitably the transformer will be connected to at least one of the lugs 42 that is connected to one of socket terminals 22 of the meter socket that carries the appropriate phase of the service, for example, coming into the junction box 20. Similarly, the transformer 50 may also be connected to the lug 42 of the adapter 40 that is positioned to mate with the socket terminal 22 of the meter socket 21 that is configured to carry the neutral portion of the service.

Figure 5:
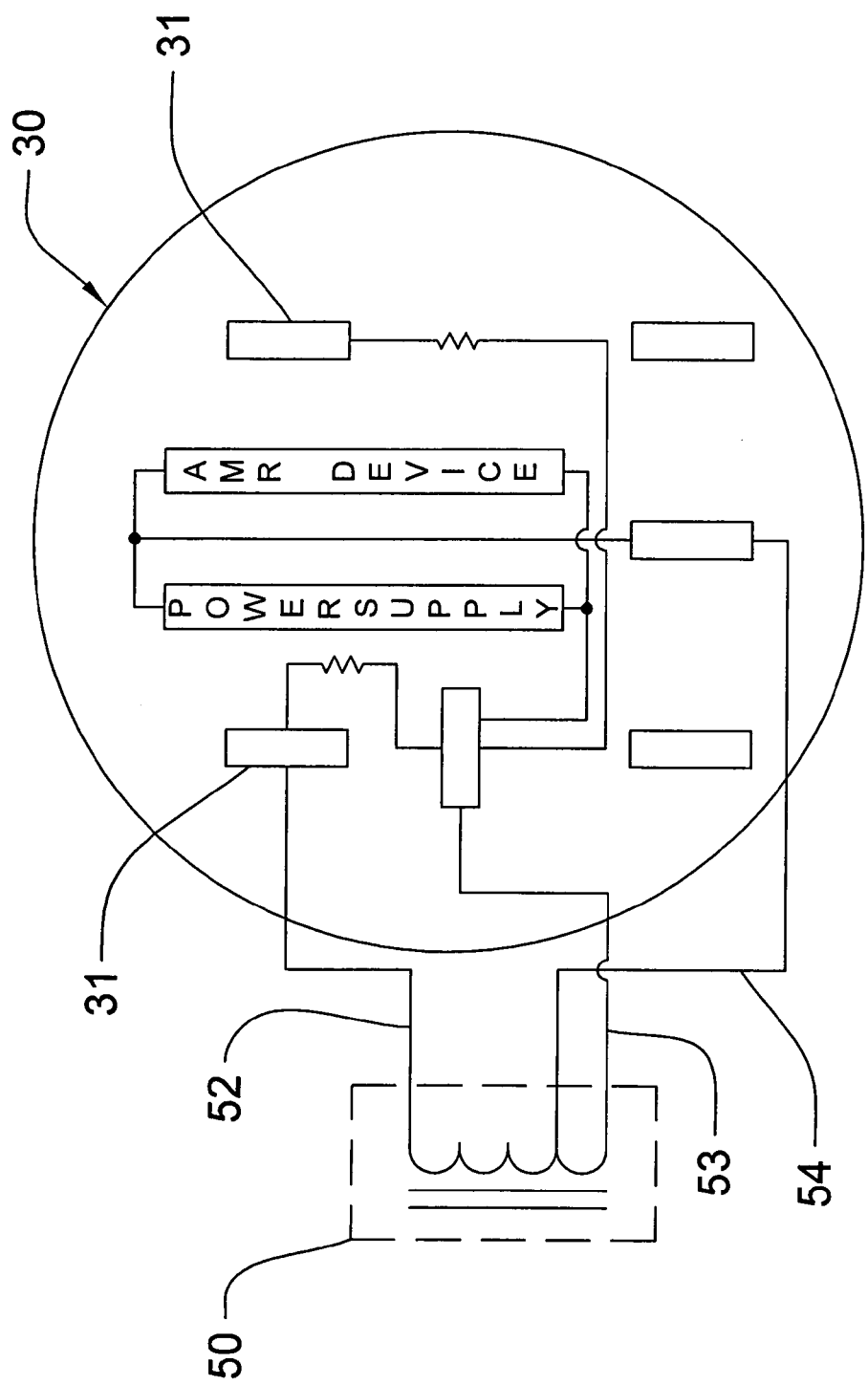
FIG. 5 is a schematic electrical interconnection diagram of the present invention.

FIG. 5 shows an illustrative electrical connection of the transformer 50 between two of the three phases of the three-phases of the three phase service of this example. As noted previously, the transformer 50 could be connected between the one phase of the three phases and the neutral of the three phase service. In at least one embodiment of the invention, the step down transformer 50 comprises an auto-transformer 50. The step-down transformer 50 may have at least one secondary lead 54 that carries an electrical supply derived from the primary connection of the transformer 50.

The adapter 40 also includes conductors that are in electrical communication with the lugs 42 of the first portion 41 that carry each of the phases and the neutral of the three phase service through the adapter 40, and to a socket terminal 61 located on the second end or portion that forms an adapter meter socket 60, which includes a plurality of the socket terminals 61. Generally, the adapter meter socket 60 of the adapter 40 includes at least as many socket terminals 61 as the meter socket 21 to which the adapter 40 is to be connected so as to provide the meter 30 with the appropriate points of connection for monitoring the power carried through the service, although it is conceivable that more or less terminals 61 might be employed. Again, in a sense, the adapter meter socket 60 of the adapter 40 may mimic, or may be configured similar to, the portion of the meter socket 21 which is designed to mate with the meter 30, although it should be realized that an identical configuration is not required.

Optionally, the adapter meter socket 60 on the second portion of the adapter 40 may be provided with one additional socket terminal 61 (carrying the stepped-down voltage electrical supply) than the number of socket terminals 22 that are present in the meter socket 21 of the junction box 20 to which the adapter 40 is connectable. The original or existing electrical meter 30 may thus be modified to utilize the stepped-down voltage electrical supply produced by the transformer 50 of the adapter 40 by adding an additional lug 31 to the back side of the meter 30 that is positioned to mate with the additional socket terminal 61 of the adapter meter socket 60. As an illustrative example only, the form 12-S meter has an alternate position for one of the lugs, and as such the alternate position could be used to receive the additional lug 31. The meter 30 may also utilize an internal modification in the form of a cut and/or jump to supply the data transmission system (or automated meter reading (AMR) system), such as a TURTLE device, and thus the meter power supply circuitry may utilize the stepped-down voltage electrical supply instead of the original higher voltage supply. Once modified, the meter 30 can be installed onto the adapter sleeve 40. This configuration has the benefit of allowing the user to maximize the reuse of the existing equipment and thereby reduce the capital expenditure necessary to improve the safety, reliability, and functionality of the electrical power consumption metering system. Additionally, as there is not currently any data transmission systems (such as the TURTLE or similar device) designed to be powered by directly connecting to 480 volt systems, the present invention provides the advantages provided by this type of automated data transmission to be realized on a vast number of existing 480 volt services.

Another preferred embodiment of the invention contemplates a second retrofit configuration that is similar to the first retrofit configuration except that no meter modification is needed. In this second retrofit configuration, a new meter form would be designed to be used in conjunction with the adapter 40 to take advantage of the stepped down voltage electrical supply available from the adapter 40. In this embodiment, the meter used prior to retrofit would be removed and replaced with the new meter 30. The new meter 30 would be of a standard form with a lug configuration to accommodate the standard supply lines as well at the stepped down voltage electrical supply generated by the step-down voltage transformer in the adapter 40.

Although the foregoing has described the step down transformer circuitry in the context of an adapter that is intended to be situated between the meter socket and the meter, it should be realized that the invention is not necessarily so limited. For example, in the situation of a new service installation, it is envisioned that the step-down transformer may be accommodated in one of two manners. The first new installation configuration may utilize a step down transformer installed separately in the junction box and relatively permanently connected to an additional socket terminal 22 of the meter socket on the service side of the meter socket. A meter 30 having an additional lug 31 to receive the stepped down voltage electrical supply as well as the other input and output connections could then be installed onto the socket terminal 22. The second new installation configuration could be achieved by integrating the step-down voltage transformer directly into the meter 30 itself, such that the transformer becomes a part of the meter circuitry itself.

All four of these contemplated embodiments provide the advantages of reducing the likelihood of a MOV-induced flashover by reducing the voltage presented as well as the current available to support such a failure. Additionally each of these four configurations makes existing data transmitters (e.g., such as the TURTLE device) or automated meter readers available on 480 volt services.

Turning to a more detailed description of the preferred embodiment of the adapter 40, it should be noted that although FIGS. 1 through 5 are consistent with an electrical power consumption metering system utilizing an ANSI Form 12S meter, the adapter 40 may be constructed in virtually any form so as to accommodate any meter and electrical configuration. The standard Form 12S meter is used as an illustrative example because of its commonality on three-phase, and especially three-phase 480 volt, systems.

Figure 2:
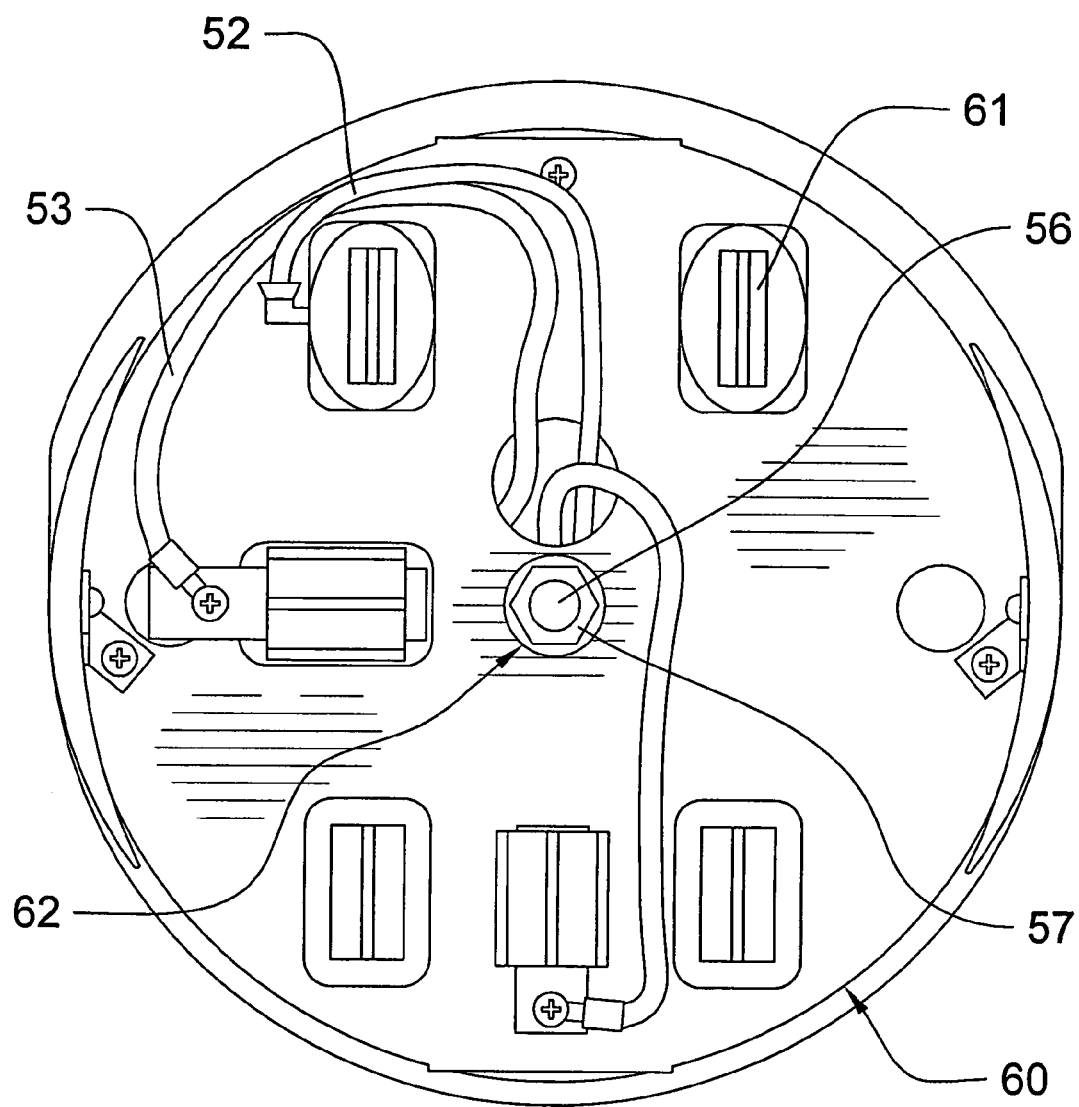
FIG. 2 is a schematic view of a first end of the adapter which is suitably configured to couple to an electrical meter.

In the illustrative embodiment of the adapter 40, the exterior of the housing of the adapter 40 is substantially cylindrical in shape, although other shapes may be employed. A lower interior space 43 of the adapter 40 is bounded by the first portion 41 of the adapter 40 on the end of the adapter that is mountable to the meter socket 21, the adapter meter socket 60 on the end of the adapter that is mountable to the meter 30, and a perimeter wall 70 that extends between the two ends. The step-down voltage transformer may be positioned in the lower interior space 43. Most preferably, the step down transformer is a torroidal auto-transformer 50, although other configurations of step down transformers may also be employed. There may be an aperture that extends through the auto-transformer 50 along a longitudinal axis of the auto-transformer 50. The male portion 41 of the adapter sleeve 40 may also have an aperture that is alignable with the aperture of the auto-transformer 50. A bolt 56, stud or other suitable fastening device can then be inserted through the aligned apertures of the auto-transformer 50 and the male portion 41 to thereby mount the auto-transformer 50 on the adapter. FIG. 2 shows a nut 57 that is mounted on the bolt 56 to secure the auto-transformer 50 to the male portion 41 of the adapter sleeve 40. FIG. 2 also shows an aperture 62 that extends through a bottom of the adapter meter socket 60 and that is larger than the nut 57 used to secure the auto-transformer 50. This relationship helps prevent the bottom of the adapter meter socket 60 from being compressed into the auto-transformer 50 which could damage the auto-transformer 50. Additionally, FIG. 2 shows the two primary leads 52, 53 of the auto-transformer 50 being connected to the socket terminals 61 of two of the three phases of the electrical service and the single secondary lead 51 from the auto-transformer 54 used to supply the data transmitter (AMR) and power supply circuits of the electrical meter 30.

The auto-transformer 50 can have a wide variety of turns ratios. Turns ratios of approximately 2:1 and approximately 4:1 are anticipated to be the most preferred turn ratios for the auto-transformer, although other ratios may be employed. It should be noted that an approximately 2.5:1 turns ratio auto-transformer would convert the 277 volts found in phase to neutral in a conventional 480 volt four wire wye service to approximately 110 volts.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. An apparatus for use in conjunction with electrical power service including a meter socket with N socket terminals for making N electrical connections, and a meter having N lug connections for removably connecting to the N socket terminals of the meter socket, the meter including voltage sensing circuits and current sensing circuits, the apparatus comprising:

an adapter couplable between the meter socket and the meter, the adapter comprising:

first electrical contact means for making electrical contact with the socket terminals of the meter socket;

second electrical contact means for making electrical contact with the lug connections of the meter;

means for carrying a primary voltage between the first electrical contact means and the second electrical contact means; and voltage reduction circuitry for producing a secondary voltage from the primary voltage carried by the means for carrying the primary voltage, the secondary voltage being less than the primary voltage.

2. The apparatus of claim 1 wherein the adapter further comprises first mounting means for mounting the adapter to the meter socket and second mounting means for mounting the adapter to the meter.

3. The apparatus of claim 1 wherein the voltage reduction circuitry is electrically coupled to the means for carrying a primary voltage to conduct at least one phase of the electrical power service.

4. The apparatus of claim 1 wherein the adapter further comprises means for electrically coupling the voltage reduction circuitry to the meter to supply the secondary voltage to the meter.

5. The apparatus of claim 1 wherein the voltage reduction circuitry includes a transformer.

6. The apparatus of claim 1 wherein the voltage reduction circuitry includes an auto-transformer.

7. The apparatus of claim 1 wherein the first electrical contact means of the adapter includes N lugs arranged in a pattern and the second electrical contact means includes N socket terminals arranged in a pattern corresponding to the pattern of the N lugs.

8. The apparatus of claim 1 wherein the first electrical contact means of the adapter includes N lugs arranged in a pattern and the second electrical contact means includes N+1 socket terminals, at least a portion of the N+1 socket terminals being arranged in a pattern corresponding to the pattern of the N lugs.

9. The apparatus of claim 1 wherein the voltage reduction circuitry includes two conductors, a first one of the two conductors being electrically connected to the means for carrying a primary voltage to conduct one phase of the electrical power service, and a second one of the two conductors being electrically connected to the means for carrying a primary voltage to conduct either of: one phase and one phase of the electrical power service or a neutral of the electrical power service.

10. An apparatus for use in conjunction with electrical power service including a meter socket with N socket terminals for making N electrical connections, and a meter having N lug connections for removably connecting to the N socket terminals of the meter socket, the meter including voltage sensing circuits and current sensing circuits, the apparatus comprising:

an adapter couplable between the meter socket and the meter, the adapter comprising:
        a first electrical contact configured to make electrical contact with the socket terminals of the meter socket when the adapted to mounted on the meter socket;
        a second electrical contact configured to make electrical contact with the lug connections of the meter when the meter is mounted on the adapter;
        conductors configured to carry a primary voltage between the first electrical contact and the second electrical contact; and
        voltage reduction circuitry for producing a secondary voltage from the primary voltage carried by the conductors, the secondary voltage being less than the primary voltage.

11. The apparatus of claim 10 wherein the adapter further comprises a first mounting structure configured to mount the adapter to the meter socket and a second mounting structure configured to mount the adapter to the meter.

12. The apparatus of claim 10 wherein the voltage reduction circuitry is electrically coupled to at least one conductor of the conductors to conduct at least one phase of the electrical power service.

13. The apparatus of claim 10 wherein the adapter further comprises a contact electrically coupled to the voltage reduction circuitry and configured to supply the secondary voltage to the meter when the meter is mounted on the adapter.

14. The apparatus of claim 10 wherein the voltage reduction circuitry includes a transformer.

15. The apparatus of claim 10 wherein the voltage reduction circuitry includes an auto-transformer.

16. The apparatus of claim 10 wherein the first electrical contact of the adapter includes N lugs arranged in a pattern and the second electrical contact includes N socket terminals arranged in a pattern corresponding to the pattern of the N lugs.

17. The apparatus of claim 10 wherein the first electrical contact of the adapter includes N lugs arranged in a pattern and the second electrical contact includes N+1 socket terminals, at least a portion of the N+1 socket terminals being arranged in a pattern corresponding to the pattern of the N lugs.

18. The apparatus of claim 10 wherein the voltage reduction circuitry includes two conductors, a first one of the two conductors being electrically connected to a first conductor of the conductors configured to conduct one phase of the electrical power service, and a second one of the two conductors being electrically connected to a second conductor of the conductors configured to conduct either of: one phase and one phase of the electrical power service or a neutral of the electrical power service.

19. A system for improving the operational safety of electrical power consumption monitoring devices, the system comprising:

a meter socket for carrying at least one phase of an electrical power service at a primary voltage and for being connected to an electrical load;
    a meter electrically couplable to the meter socket to sense the at least one phase of the electrical power service conductor and the electrical load through the meter socket, the meter having voltage sensing and current sensing circuits; and
    a voltage reduction device electrically coupled to the at least one phase of the electrical power service, the voltage reduction device generating a secondary voltage that is less than the primary voltage.

* * * * *